(12) United States Patent
Lee et al.

(10) Patent No.: US 11,926,897 B2
(45) Date of Patent: Mar. 12, 2024

(54) NIOBIUM PRECURSOR COMPOUND FOR THIN FILM DEPOSITION AND METHOD FOR FORMING NIOBIUM-CONTAINING THIN FILM USING SAME

(71) Applicant: EGTM Co., Ltd., Suwon-Si (KR)

(72) Inventors: Tae Young Lee, Suwon-Si (KR); Sung Jun Ji, Suwon-Si (KR); Shin Beom Kim, Seongnam-Si (KR); Sun Young Baik, Incheon (KR)

(73) Assignee: EGTM Co., Ltd. (KR)

( * ) Notice: Subject to any disclaimer, the term of this patent is extended or adjusted under 35 U.S.C. 154(b) by 0 days.

(21) Appl. No.: 17/752,942

(22) Filed: May 25, 2022

(65) Prior Publication Data

US 2023/0101446 A1 Mar. 30, 2023

(30) Foreign Application Priority Data

Aug. 31, 2021 (KR) .......................... 10-2021-0115634

(51) Int. Cl.
*C23C 16/455* (2006.01)
*C01G 33/00* (2006.01)
*C23C 16/40* (2006.01)

(52) U.S. Cl.
CPC ........ *C23C 16/45553* (2013.01); *C01G 33/00* (2013.01); *C23C 16/405* (2013.01)

(58) Field of Classification Search
CPC ................ C23C 14/083; C23C 16/405; C23C 16/45553; C07F 9/00
See application file for complete search history.

(56) References Cited

U.S. PATENT DOCUMENTS

| | | | |
|---|---|---|---|
| 5,258,204 A | 11/1993 | Wernberg et al. | |
| 9,518,075 B2 * | 12/2016 | Lansalot-Matras | ........ C07F 9/00 |
| 11,634,441 B2 * | 4/2023 | Lee ........................... C07F 9/00 556/43 |
| 2014/0106071 A1 * | 4/2014 | Lansalot-Matras ........ C07F 9/00 427/255.6 |
| 2016/0251756 A1 * | 9/2016 | Lansalot-Matras ........................ H01L 21/02271 427/252 |
| 2017/0152144 A1 * | 6/2017 | Lansalot-Matras ........................ C01B 21/0617 |
| 2019/0202847 A1 * | 7/2019 | Han ...................... H01L 21/285 |
| 2021/0403492 A1 * | 12/2021 | Lee ........................... C07F 9/00 |

FOREIGN PATENT DOCUMENTS

JP H06-088238 A 3/1994

OTHER PUBLICATIONS

V. Gibson et al., Dalton Transactions, 4457-4465 (2003) (Year: 2003).*
Notice of Allowance dated Dec. 21, 2023 issued from the Korean Intellectual Property Office for KR Application No. KR10-2021-0115634.
English Translation of Notice of Allowance dated Dec. 21, 2023 issued from the Korean Intellectual Property Office for KR Application No. KR10-2021-0115634.

* cited by examiner

*Primary Examiner* — Alexander R Pagano

(57) ABSTRACT

According to an embodiment of the present disclosure, a niobium precursor compound is represented by Chemical Formula 1 or Chemical Formula 2 below:

[Chemical Formula 1]

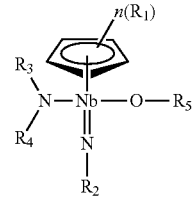

[Chemical Formula 2]

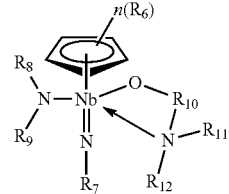

Therefore, the niobium precursor compound according to an embodiment of the present disclosure has excellent thermal stability, exists in a liquid state at room temperature, and has high volatility, thereby having an advantage which is advantageous for application to a thin film forming process. Further, the niobium thin film formed using the niobium precursor compound according to an embodiment of the present disclosure has a small residual content and has uniform physical properties.

17 Claims, 2 Drawing Sheets

NIOBIUM PRECURSOR COMPOUND FOR THIN FILM DEPOSITION AND METHOD FOR FORMING NIOBIUM-CONTAINING THIN FILM USING SAME

CROSS-REFERENCE TO RELATED APPLICATIONS

This application claims the priority of Korean Patent Application No. 10-2021-0115634 filed on Augu.31, 2021, in the Korean Intellectual Property Office, the disclosure of which is incorporated herein by reference.

BACKGROUND

Field

The present disclosure relates to a niobium precursor compound and a method for forming a niobium-containing thin film using the same, and more particularly, to a heteroleptic niobium compound used as a precursor for thin film deposition and a method for forming a niobium-containing thin film using the same.

Description of the Related Art

As electronic technology develops, the demand for miniaturization and weight reduction of electronic devices used in various electronic devices is rapidly increasing. Various physical and chemical deposition methods have been proposed in order to form fine electronic devices, and various researches for manufacturing various electronic devices such as metal thin films, metal oxide thin films, or metal nitride thin films by these deposition methods are in progress.

In manufacturing a semiconductor device, a thin film containing a Group 5 metal compound is generally formed using a metal organic chemical vapor deposition (MOCVD) or atomic layer deposition (ALD) process.

Since the ALD process undergoes a self-limiting reaction compared to the MOCVD process, it has excellent step coverage, and since it is a relatively low-temperature process, it has the advantage of avoiding a drop in device properties due to thermal diffusion.

In order to deposit a thin film containing niobium (Nb) among Group 5 metal compounds, it is very important to select a precursor compound suitable for the deposition process. Currently, various types of niobium precursors exist in the semiconductor industry. As a conventional niobium precursor compound, a niobium halide such as niobium (V) chloride, a niobium alkoxide such as niobium (V) ethoxide, or the like is known. Such a niobium precursor compound is a homoleptic precursor compound composed of one or more identical ligands. In the case of a niobium halide, it has high thermal stability, wide deposition temperature range, and sufficient reactivity, but has a low vapor pressure since it is a solid at room temperature. Further, there is a disadvantage in that it is difficult to form a thin film with uniform physical properties since by-products generated in the deposition process affect the physical properties of the thin film. Further, in the case of a niobium alkoxide, since it has a sufficient vapor pressure and a low melting point, it is easy to synthesize the niobium alkoxide in a liquid phase, but since it is easily decomposed during the thin film formation process due to low thermal stability, it has a disadvantage in that the carbon content in the thin film is high.

Accordingly, a heteroleptic precursor compound has recently been proposed in order to supplement the shortcomings of a homoleptic precursor compound. The heteroleptic precursor compound contains two or more different ligands. Typical examples of the heteroleptic precursor compound may include an alkylamide-imide-based precursor compound such as tris (diethylamido) (tert-butylimido) niobium(V). Such an alkylamide-imide-based precursor compound has a thin film growth per cycle (GPC) secured in a wide temperature range so that a high-quality thin film can be formed compared to a homoleptic precursor material. However, there is a disadvantage in that the carbon content in the thin film is high at low temperatures.

Ligands having different chemical structures have different reactivity with a reactive gas even when a deposition process is performed under the same conditions, and form different deposition surfaces. In particular, the charge trapping density may be affected depending on the number of ligands of the precursor compound reacting with the surface of the hydroxyl end in the ALD process, and this may affect the thin film quality. Accordingly, an ideal thin film having a low charge trapping density may be obtained by substantially identically controlling the number of ligands reacting in each cycle. However, known heteroleptic niobium precursor compounds have had limitations in improving the process efficiency by having problems due to rapid reactivity and high ligand exchangeability, and difficulty in controlling vapor pressure. In particular, the niobium precursor compound should have thermal stability during the MOCVD process so that it decomposes on a heated substrate and does not decompose during transport. Further, during the ALD process, although it is not decomposed by heat, the niobium precursor compound should have high thermal stability and reactivity so that it can react with the counterpart reactant when exposed to a counterpart reactant.

Therefore, there is still a need for a precursor compound capable of forming a high-quality uniform thin film by existing in a liquid state at room temperature and having excellent thermal stability and reactivity so that it can be easily used in the ALD process as well as the MOCVD process.

SUMMARY

An object of the present disclosure is to provide a niobium precursor compound that is suitable for thin film growth, has strong thermal stability, has a high vapor pressure, and exists in a liquid state at room temperature, thereby enabling process problems caused by the use of a conventional niobium precursor compound to be solved.

Another object of the present disclosure is to provide a niobium precursor composition for thin film deposition capable of providing a high-quality uniform thin film using the niobium precursor compound.

Another object of the present disclosure is to provide a method for forming a niobium-containing thin film, which is capable of forming a high-quality thin film while having excellent process efficiency by using the niobium precursor composition for thin film deposition.

The problems of the present disclosure are not limited to the problems mentioned above, and other problems not mentioned will be clearly understood by those skilled in the art from the following description.

An embodiment of the present disclosure provides a niobium precursor compound represented by Chemical Formula 1 or Chemical Formula 2 below.

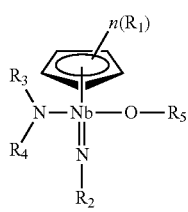

[Chemical Formula 1]

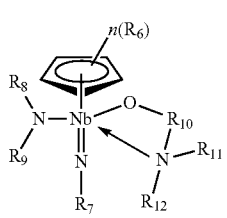

[Chemical Formula 2]

(In Chemical Formula 1, $R_1$ and $R_2$ are each independently selected from a linear alkyl group having 1 to 6 carbon atoms and a branched alkyl group having 3 to 6 carbon atoms, and $R_3$, $R_4$, and $R_5$ are each independently selected from hydrogen, a linear alkyl group having 1 to 10 carbon atoms, and a branched alkyl group having 3 to 10 carbon atoms, in Chemical Formula 2, $R_6$ and $R_7$ are each independently selected from a linear alkyl group having 1 to 6 carbon atoms and a branched alkyl group having 3 to 6 carbon atoms, $R_8$ and $R_9$ are each independently selected from hydrogen, a linear alkyl group having 1 to 10 carbon atoms, and a branched alkyl group having 3 to 10 carbon atoms, $R_{10}$ is selected from a linear alkylene group having 1 to 20 carbon atoms and a branched alkylene group having 3 to 20 carbon atoms, and $R_{11}$ and $R_{12}$ are each independently selected from hydrogen and a linear alkyl group having 1 to 4 carbon atoms, and in Chemical Formulas 1 and 2, n is an integer of 1 to 5).

Another embodiment of the present disclosure provides a precursor composition for depositing a niobium-containing thin film, and a precursor composition for thin film deposition according to an embodiment of the present disclosure includes the niobium precursor compound represented by Chemical Formula 1 or Chemical Formula 2 above.

Another embodiment of the present disclosure provides a method for forming a niobium-containing thin film, the method which deposits a thin film on a substrate through a metal organic chemical vapor deposition (MOCVD) process or atomic layer deposition (ALD) process using the niobium precursor compound represented by Chemical Formula 1 or Chemical Formula 2 above.

Specific matters of other embodiments are included in the detailed description and drawings.

The niobium precursor compound according to an embodiment of the present disclosure has excellent thermal stability, exists in a liquid state at room temperature, and has high volatility, thereby having an advantage which is advantageous for application to a thin film forming process. In particular, the niobium precursor compound according to the present disclosure has excellent thermal stability and high reactivity so that a good quality niobium thin film can be formed when a thin film is formed by an MOCVD process or ALD process.

Some ligands contained in the niobium precursor compound according to an embodiment of the present disclosure include a relatively sterically hindered substituent. Accordingly, when the niobium precursor compound is prepared, the purification of the product can be facilitated to contribute to the improvement of purity.

Further, when the ALD process is performed using the niobium precursor compound according to an embodiment of the present disclosure, the quality of the thin film can be further improved by maintaining a constant thin film growth per cycle (GPC) in a wide temperature range.

Further, the niobium thin film formed of the niobium precursor compound according to an embodiment of the present disclosure can be used for various purposes such as a dielectric, a barrier film, and an electrode by having excellent thermal stability, excellent morphological properties, low diffusivity, low leakage, and low charge trapping properties.

The effects according to the present disclosure are not limited by the contents exemplified above, and more various effects are included in the present disclosure.

DETAILED DESCRIPTION OF THE EMBODIMENT

Figure 1:
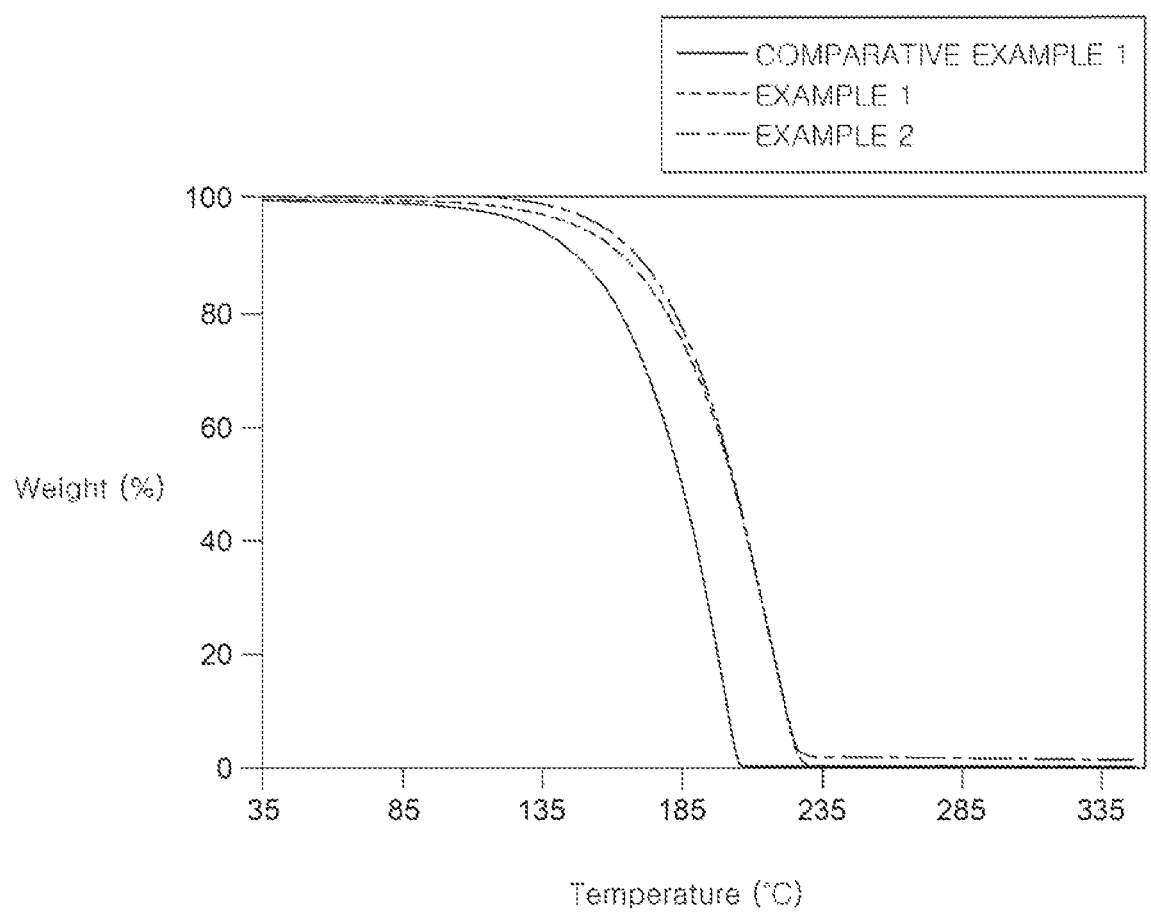
FIG. 1 is a graph showing thermogravimetric analysis (TGA) results of each niobium precursor compound according to Example 1, Example 2, and Comparative Example 1.

Advantages and features of the present disclosure and methods of achieving them will become apparent with reference to the Examples to be described later in detail in conjunction with the accompanying drawings. However, the present disclosure is not limited to the Examples disclosed below, but will be implemented in a variety of different shapes, only the present Examples are provided so that the disclosure of the present disclosure is complete, and to completely inform those of ordinary skill in the art to which the present disclosure pertains of the scope of the invention, and the present disclosure is only defined by the scope of the claims.

In describing the present disclosure, if it is determined that a detailed description of a related known technology may unnecessarily obscure the gist of the present disclosure, the detailed description thereof will be omitted. When 'including', 'having', 'consisting', etc. mentioned in the present disclosure are used, other parts may be added unless 'only' is used. When a component is expressed in the singular number, cases including the plural number are included unless otherwise explicitly stated.

In interpreting the components, it is interpreted as including an error range even if there is no separate explicit description.

Throughout the present specification, the term "room temperature" means a temperature of 15° C. to 30° C., or 20° C. to 27° C.

The niobium precursor compound according to an embodiment of the present disclosure may be represented by Chemical Formula 1 below.

[Chemical Formula 1]

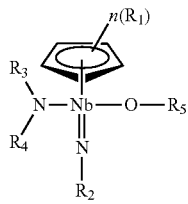

In Chemical Formula 1, $R_1$ and $R_2$ may each independently be any one selected from a linear alkyl group having 1 to 6 carbon atoms and a branched alkyl group having 3 to 6 carbon atoms. For example, $R_1$ may be a linear alkyl group having 1 to 3 carbon atoms, and $R_2$ may be a branched alkyl group having 3 to 6 carbon atoms, but is not limited thereto.

In Chemical Formula 1, $R_3$, $R_4$, and $R_5$ may each independently be any one selected from hydrogen, a linear alkyl group having 1 to 10 carbon atoms, and a branched alkyl group having 3 to 10 carbon atoms. Specifically, for example, $R_3$ and $R_4$ may each be a linear alkyl group having 1 to 6 carbon atoms, and $R_5$ may be a branched alkyl group having 3 to 6 carbon atoms, but is not limited thereto.

In Chemical Formula 1, n is an integer of 1 to 5.

For example, in Chemical Formula 1, n may be 1, and $R_1$ may be a linear alkyl group having 1 to 6 carbon atoms. Preferably, for example, $R_1$ in Chemical Formula 1 may be a methyl group. In the case of including such a methylcyclopentadiene structure, the bonding force with a metal may be reduced compared to a cyclopentadiene structure that does not contain a methyl group. Accordingly, the unnecessary residual content in the thin film formed through the deposition process may be significantly reduced. Further, in the case of including a methylcyclopentadiene structure, the synthesis of a heteroleptic niobium precursor compound may be facilitated due to the masking effect of methylcyclopentadiene. Furthermore, a heteroleptic niobium precursor compound having high purity may be obtained by improving the purification efficiency of the niobium precursor compound.

More specifically, the niobium precursor compound may be a compound represented by Chemical Formula 3 below.

[Chemical Formula 3]

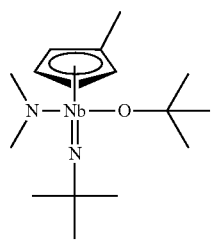

The niobium precursor compound having the structure as in Chemical Formula 3 has more excellent thermal stability and can further reduce the residual content when forming a thin film. Further, it exhibits a constant thin film growth per cycle (GPC) in a wide temperature range in the deposition process, and may be utilized in the ALD process as well as the MOCVD process.

The niobium precursor compound according to another embodiment of the present disclosure may be represented by Chemical Formula 2 below.

[Chemical Formula 2]

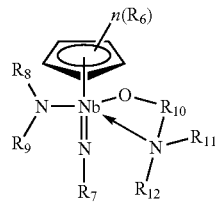

The niobium precursor compound according to Chemical Formula 2 forms a stable structure while the nitrogen atom of the ligand —$OR_{10}N(R_{11})(R_{12})$ bonded to the niobium atom forms a coordination bond with the niobium atom. Accordingly, the niobium precursor compound represented by Chemical Formula 2 has a more stable structure than that of the niobium precursor compound of Chemical Formula 1, thereby having an advantage of more excellent thermal stability. Therefore, the thin film formed by the deposition process using the niobium precursor compound represented by Chemical Formula 2 has a more reduced residual content and exhibits a constant thin film growth per cycle (GPC) in a wider temperature range. Accordingly, a thin film prepared using the niobium precursor compound represented by Chemical Formula 2 exhibits higher quality properties.

In Chemical Formula 2, $R_6$ and $R_7$ may each independently be any one selected from a linear alkyl group having 1 to 6 carbon atoms and a branched alkyl group having 3 to 6 carbon atoms. Specifically, for example, $R_6$ may be a linear alkyl group having 1 to 3 carbon atoms, and $R_7$ may be a branched alkyl group having 3 to 6 carbon atoms, but is not limited thereto.

In Chemical Formula 2, $R_8$ and $R_9$ may each independently be any one selected from hydrogen, a linear alkyl group having 1 to 10 carbon atoms, and a branched alkyl group having 3 to 10 carbon atoms. Specifically, for example, $R_8$ and $R_9$ may each be a linear alkyl group having 1 to 6 carbon atoms, but are not limited thereto.

In Chemical Formula 2, Rio may be selected from a linear alkylene group having 1 to 20 carbon atoms and a branched alkylene group having 3 to 20 carbon atoms. Specifically, for example, $R_{10}$ may be a linear alkylene group having 1 to 6 carbon atoms, but is not limited thereto.

In Chemical Formula 2, $R_{11}$ and $R_{12}$ may each independently be any one selected from hydrogen and a linear alkyl group having 1 to 4 carbon atoms. Specifically, for example, $R_{11}$ and $R_{12}$ may each be a linear alkyl group having 1 to 6 carbon atoms, but are not limited thereto.

In Chemical Formula 2, n is an integer of 1 to 5.

For example, in Chemical Formula 2, n may be 1, and $R_6$ may be a linear alkyl group having 1 to 6 carbon atoms. Preferably, for example, $R_6$ in Chemical Formula 2 may be a methyl group. As described above, when the methylcyclopentadiene structure is included, the bonding force with the metal is reduced compared to cyclopentadiene that does not contain a methyl group so that the unnecessary residual content in the thin film may be significantly reduced. Further, the synthesis and purification of the heteroleptic niobium precursor compound are facilitated due to the masking effect of methylcyclopentadiene so that a niobium precursor compound with high purity and high quality may be obtained.

More specifically, the niobium precursor compound may be a compound represented by Chemical Formula 4 below.

[Chemical Formula 4]

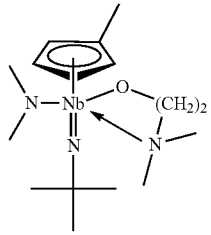

The niobium precursor compound represented by Chemical Formula 4 may further improve thermal stability, and further reduce the residual content when forming a thin film. Accordingly, the thin film prepared by the deposition process using the niobium precursor compound of Chemical Formula 4 has more excellent physical properties.

The niobium precursor compound represented by Chemical Formula 1 or Chemical Formula 2 may be used as a precursor composition for depositing a niobium-containing thin film.

Further, since the niobium precursor compound according to an embodiment of the present disclosure exists in a liquid state at room temperature, it is easy to store and handle, and has high volatility so that it may be advantageously applied to form a thin film using a deposition process.

Hereinafter, a method for forming a niobium-containing thin film according to an embodiment of the present disclosure will be described in detail. The method for forming the niobium-containing thin film uses the above-described niobium precursor compound, and an overlapping description related to the niobium precursor compound is omitted.

In the method for forming the niobium-containing thin film according to an embodiment of the present disclosure, a thin film is deposited on a substrate through a deposition process using the niobium precursor compound represented by Chemical Formula 1 or Chemical Formula 2.

The deposition process may include an atomic layer deposition (ALD) process or a chemical vapor deposition (CVD) process, for example, a metal organic chemical vapor deposition (MOCVD) process. The deposition process may be carried out at 50 to 700° C.

First, the niobium precursor compound represented by Chemical Formula 1 or Chemical Formula 2 is transferred onto a substrate. For example, the niobium precursor compound may be supplied onto the substrate by a method such as a bubbling method, a vapor phase mass flow controller method, a direct gas injection (DGI) method, a direct liquid injection (DLI) method, or a liquid transfer method in which it is dissolved in an organic solvent and transferred, but is not limited thereto.

More specifically, the niobium precursor compound may be mixed with a carrier gas or diluent gas including one or more selected from the group consisting of argon (Ar), nitrogen ($N_2$), helium (He), and hydrogen ($H_2$), and transferred onto the substrate by a bubbling method or a direct gas injection method.

Meanwhile, the deposition process may include a step of supplying one or more reaction gases selected from the group consisting of water vapor ($H_2O$), oxygen ($O_2$), ozone ($O_3$), and hydrogen peroxide ($H_2O_2$) when forming a niobium thin film.

As another example, the deposition process may include a step of supplying one or more reaction gases selected from the group consisting of ammonia ($NH_3$), hydrazine ($N_2H_4$), nitrous oxide ($N_2O$), and nitrogen ($N_2$) when forming a niobium thin film.

The niobium thin film manufactured by the method for forming a thin film according to an embodiment of the present disclosure may provide a high-quality thin film by effectively reducing the amount of residue. Further, according to the method for forming a thin film according to an embodiment of the present disclosure, a niobium thin film having more uniform physical properties by exhibiting a constant thin film growth per cycle (GPC) within a wide thin film growth temperature range may be provided.

Hereinafter, the niobium precursor compound according to the present disclosure will be described in more detail through the following Examples. However, this is only presented to help the understanding of the present disclosure, and the present disclosure is not limited to the following Examples.

EXAMPLE 1

1. Preparation of Intermediate Compound 32.9 g (0.111 mol, 1 equivalent) of (tert-butylimido)tris(dimethylamido)niobium((tBuN)(NMe$_2$)$_3$Nb) and 300 mL of n-hexane were injected into a flame-dried 500 mL Schlenk flask, and then stirred at room temperature. After adding 11 g (0.137 mol, 1.2 equivalents) of methylcyclopentadiene (C$_5$MeH$_5$) dropwise to the flask at −20° C. or lower, the reaction solution was stirred at room temperature for 12 hours. Thereafter, the solvent was removed from the reaction solution under reduced pressure, and the solvent-removed reaction solution was distilled under reduced pressure to obtain 26.5 g (yield 72%) of a pale yellow liquid compound represented by (η-C$_5$H$_4$CH$_3$)(tBuN)Nb(N(CH$_3$)$_2$)$_2$.

The synthesis of an intermediate compound (η-C$_5$H$_4$CH$_3$)(tBuN)Nb(N(CH$_3$)$_2$)$_2$ represented by Chemical Formula A below was confirmed through nuclear magnetic resonance analysis ($^1$H NMR).

[Chemical Formula A]

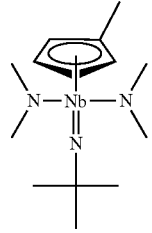

2. Preparation of Compound (η-C$_5$H$_4$CH$_3$)(tBuN)Nb(N(CH$_3$)$_2$) (tBuO)

26.5 g (0.08 mol, 1 equivalent) of the intermediate compound (tert-butylimido)bis(dimethylamido)(methylcyclopentadienyl)niobium (η-C$_5$H$_4$CH$_3$)(tBuN)Nb(N(CH$_3$)$_2$)$_2$ prepared as described above and 150 mL of n-hexane were injected into a flame-dried 500 mL Schlenk flask, and then stirred at room temperature. After adding 6.5 g (0.088 mol, 1.1 equivalents) of tert-butanol (tBuOH) dropwise to the flask at −20° C. or lower, the reaction solution was stirred at room temperature for 12 hours. Thereafter, the solvent was removed from the reaction solution under reduced pressure, and the solvent-removed reaction solution was distilled under reduced pressure to obtain 16.7 g (yield 58%) of a pale yellow liquid compound.

The synthesis of the niobium precursor compound (η-$C_5H_4CH_3$)(tBuN)Nb(N($CH_3$)$_2$)(tBuO) represented by Chemical Formula 3 below was confirmed through nuclear magnetic resonance analysis ($^1$H NMR).

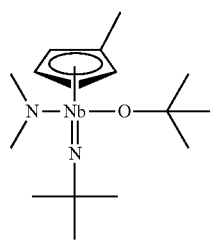

[Chemical Formula 3]

EXAMPLE 2

32.9 g (0.099 mol, 1 equivalent) of (tert-butylimido)bis(dimethylamido)(methylcyclopentadienyl)niobium (η-$C_5H_4CH_3$)(tBuN)Nb(N($CH_3$)$_2$)$_2$ obtained in the intermediate preparation step of Example 1 above and 300 mL of n-hexane were injected into a flame-dried 500 mL Schlenk flask, and then stirred at room temperature. After adding 17.7 g (0.199 mol, 2 equivalents) of dimethylethanolamine (($CH_3$)$_2$NCH$_2$CH$_2$OH) dropwise to the flask at −20° C. or lower, the reaction solution was stirred at room temperature for 24 hours. Thereafter, the solvent was removed from the reaction solution under reduced pressure, and the solvent-removed reaction solution was distilled under reduced pressure to obtain 15.7 g (yield 42%) of a pale yellow liquid compound.

The synthesis of the niobium precursor compound (η-$C_5H_4CH_3$)(tBuN)Nb(N($CH_3$)$_2$)(($CH_3$)$_2$NCH$_2$CH$_2$O) represented by Chemical Formula 4 below was confirmed through nuclear magnetic resonance analysis ($^1$H NMR).

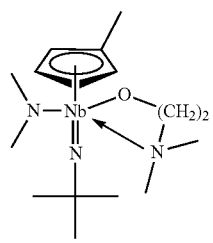

[Chemical Formula 4]

Comparative Example 1

11 g (0.029 mol, 1 equivalent) of bis(diethylamido)(tert-butylimido)(cyclopentadienyl)niobium (η-$C_5H_5$)(tBuN)Nb(NEt$_2$)$_2$ and 150 mL of n-hexane were injected into a flame-dried 500 mL Schlenk flask, and then stirred at room temperature. After adding 3.8 g (0.063 mol, 2.2 equivalents) of isopropyl alcohol [$C_3H_7OH$] dropwise to the flask at −20° C. or lower, the reaction solution was stirred at room temperature for 12 hours. The solvent was removed from the reaction solution under reduced pressure, and the solvent-removed reaction solution was distilled under reduced pressure to obtain 9 g (yield 90%) of a pale yellow liquid compound.

The synthesis of the niobium precursor compound (η-$C_5H_5$)(tBuN)Nb(OCHC$_2$H$_6$)$_2$ represented by Chemical Formula 5 below was confirmed through nuclear magnetic resonance analysis ($^1$H NMR).

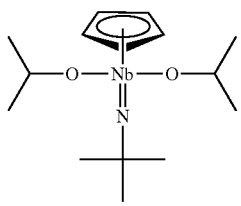

[Chemical Formula 5]

Experimental Example

1. Thermogravimetric Analysis

In order to find out the thermal properties of the compounds according to Comparative Example 1 and Examples 1 and 2 respectively, thermogravimetric analysis (TGA) was performed. First, a thermogravimetric analyzer was stored in a nitrogen glove box where the moisture and oxygen contents were kept below 1 ppm. After putting a sample of 15 mg into a crucible, it was measured while raising the temperature from 35° C. to 350° C. at a rate of 10° C./min. The mass loss of the sample was monitored as a function of the crucible temperature. The results according to this are shown in FIG. 1.

FIG. 1 is a graph showing thermogravimetric analysis (TGA) results of each niobium precursor compound according to Comparative Example 1 and Examples 1 and 2.

Referring to FIG. 1, it can be confirmed that the niobium precursor compound prepared according to each of Examples 1 and 2 has less than 2% by weight of a residual content that has not been volatilized at a temperature of 330° C. or higher. Further, it can be confirmed from the graph of FIG. 1 that the niobium precursor compound prepared according to each of Examples 1 and 2 is not decomposed or does not form by-products upon volatilization. That is, it can be seen that the niobium precursor compounds prepared according to Examples 1 and 2 are thermally stable by being volatilized with the residue hardly being remained.

Contrary to this, in the case of the niobium precursor compound according to Comparative Example 1, a mass decrease occurs near a temperature of 100° C., which is much lower than in Examples 1 and 2, and the half-life is low compared to those in Examples. It can be confirmed from this that the niobium precursor compound according to Comparative Example 1 has inferior thermal properties compared to those in Examples.

In summary, the niobium precursor compounds according to Examples 1 and 2 exist in a liquid state at room temperature to facilitate handling and purification, do not allow thermal decomposition to occur during heating, and are converted into a vapor state by being volatilized with the residue hardly being remained. Therefore, it can be seen that the niobium precursor compounds according to Examples 1 and 2 can be easily applied to the MOCVD or ALD process.

2. Thin Film Deposition Properties

Growth per cycles (GPC) of thin films during the atomic layer deposition process using the niobium precursor compounds according to Comparative Example 1, Example 1, and Example 2 were analyzed. The results according to this are shown in FIG. 2.

Figure 2:
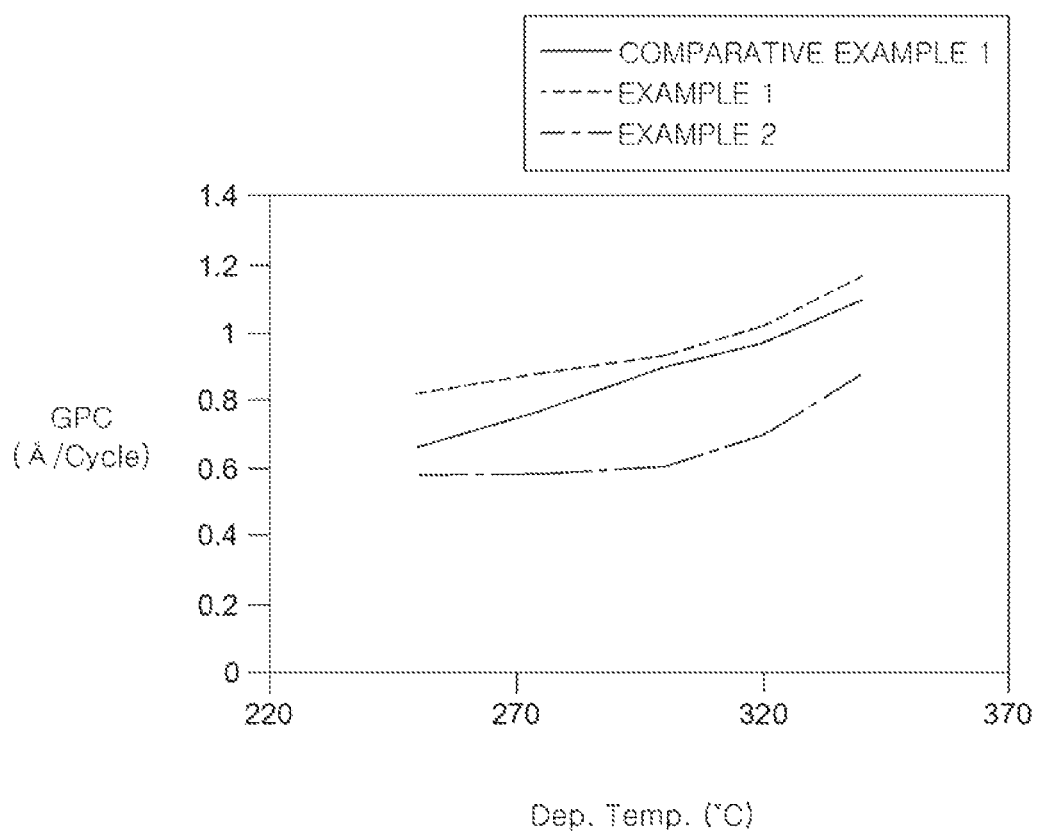
FIG. 2 is a graph showing a thin film growth per cycle (GPC) according to a deposition temperature during the atomic layer deposition process using each niobium precursor compound according to Example 1, Example 2, and Comparative Example 1.

FIG. 2 is a graph showing a thin film growth per cycle (GPC) according to a deposition temperature (Dep. Temp.) during the atomic layer deposition process using each niobium precursor compound according to Comparative Example 1, Example 1, and Example 2.

As deposition conditions, a niobium precursor compound was filled in a canister, and then it was heated to 110° C., and ozone ($O_3$) was used as an oxidizing agent. A silicon wafer was used as a reaction substrate, and deposition was performed by heating the silicon wafer from 250° C. to 340° C. After introducing a pulse of the precursor for 10 seconds, argon (Ar) was purged for 10 seconds. Subsequently, a pulse of ozone ($O_3$) was introduced into a reaction chamber for 15 seconds, and then argon (Ar) was purged for 10 seconds. 80 to 100 cycles were performed in this way. In this way, a niobium oxide thin film with the same thickness was formed for each precursor.

Referring to FIG. 2, when the niobium precursor compound according to each of Examples 1 and 2 is used during the atomic layer deposition process, it can be confirmed that, when the niobium precursor compound of Comparative Example 1 is used, the slope of the contrast curve is gentle. In particular, when the niobium precursor compound according to Example 2 is used, it can be confirmed that the thin film growth per cycle (GPC) is low, and the thin film growth per cycle (GPC) is constantly maintained within a wide temperature range.

Maintaining a constant thin film growth per cycle (GPC) in the atomic layer deposition process means that an incomplete reaction does not occur, an incidental reaction such as being deposited in a precursor state without a chemical reaction, or decomposed by heat does not occur, and a stable thin film is formed. That is, it can be seen from FIG. 2 that, when the niobium precursor compounds according to Examples 1 and 2 are used, a stable thin film deposition process is possible compared to when the niobium precursor compound of Comparative Example 1 is used. In particular, when the niobium precursor compound according to Example 2 is used, it can be seen that a uniform niobium thin film with more excellent physical properties can be obtained by exhibiting an almost constant thin film growth per cycle (GPC) within the deposition temperature range. This can be determined as a result of the niobium precursor compound of Example 2 represented by Chemical Formula 4 forming a stable structure while the nitrogen atoms of some ligands are forming a coordination bond with the niobium atoms.

Although the present disclosure has been described in detail through Examples above, other types of Examples are also possible. Therefore, the technical spirit and scope of the claims set forth below are not limited to Examples.

What is claimed is:

1. A niobium precursor compound represented by Chemical Formula 2 below:

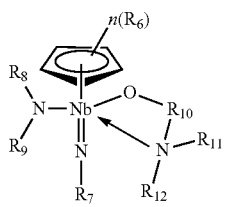

[Chemical Formula 2]

in Chemical Formula 2,
$R_6$ and $R_7$ are each independently selected from a linear alkyl group having 1 to 6 carbon atoms and a branched alkyl group having 3 to 6 carbon atoms, $R_8$ and $R_9$ are each independently selected from hydrogen, a linear alkyl group having 1 to 10 carbon atoms, and a branched alkyl group having 3 to 10 carbon atoms, $R_{10}$ is selected from a linear alkylene group having 1 to 20 carbon atoms and a branched alkylene group having 3 to 20 carbon atoms, and $R_{11}$ and $R_{12}$ are each independently selected from hydrogen and a linear alkyl group having 1 to 4 carbon atoms, and in Chemical Formula 2, n is an integer of 1 to 5.

2. The niobium precursor compound of claim 1, wherein n in Chemical Formula 2 is 1, and $R_6$ in Chemical Formula 2 are each a methyl group.

3. The niobium precursor compound of claim 1, wherein the niobium precursor compound is represented by Chemical Formula 4 below:

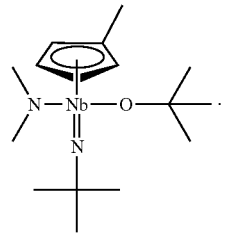

[Chemical Formula 3]

4. The niobium precursor compound of claim 1, wherein the niobium precursor compound is liquid at room temperature.

5. A precursor composition for depositing a niobium-containing thin film, comprising the niobium precursor compound of claim 1.

6. A method for forming a niobium-containing thin film, the method comprising depositing a thin film on a substrate through a metal organic chemical vapor deposition (MOCVD) process or an atomic layer deposition (ALD) process using the niobium precursor compound of claim 1.

7. The method of claim 6, wherein the deposition process is performed in a temperature range of 50 to 700° C.

8. The method of claim 6, wherein the deposition process includes a step of moving the niobium precursor compound to the substrate through one method selected from the group consisting of a bubbling method, a vapor phase mass flow controller (MFC) method, a direct gas injection (DGI) method, a direct liquid injection (DLI) method, and an organic solution supply method in which the niobium precursor compound is dissolved in an organic solvent and moved.

9. The method of claim 8, wherein the niobium precursor compound is moved together with a carrier gas onto the substrate by the bubbling method or the direct gas injection method, and the carrier gas is a mixture containing one or more selected from the group consisting of argon (Ar), nitrogen ($N_2$), helium (He), and hydrogen ($H_2$).

10. The method of claim 6, wherein the deposition process includes a step of supplying one or more reaction gases selected from the group consisting of water vapor ($H_2O$), oxygen ($O_2$), ozone ($O_3$), and hydrogen peroxide ($H_2O_2$) when forming the niobium-containing thin film.

11. The method of claim 6, wherein the deposition process includes a step of supplying one or more reaction gases selected from the group consisting of ammonia ($NH_3$), hydrazine ($N_2H_4$), nitrous oxide ($N_2O$), and nitrogen ($N_2$) when forming the niobium-containing thin film.

12. A precursor composition for depositing a niobium-containing thin film, comprising the niobium precursor compound of claim 2.

13. A precursor composition for depositing a niobium-containing thin film, comprising the niobium precursor compound of claim 3.

14. A precursor composition for depositing a niobium-containing thin film, comprising the niobium precursor compound of claim 4.

15. A method for forming a niobium-containing thin film, the method comprising depositing a thin film on a substrate through a metal organic chemical vapor deposition (MOCVD) process or an atomic layer deposition (ALD) process using the niobium precursor compound of claim 2.

16. A method for forming a niobium-containing thin film, the method comprising depositing a thin film on a substrate through a metal organic chemical vapor deposition (MOCVD) process or an atomic layer deposition (ALD) process using the niobium precursor compound of claim 3.

17. A method for forming a niobium-containing thin film, the method comprising depositing a thin film on a substrate through a metal organic chemical vapor deposition (MOCVD) process or an atomic layer deposition (ALD) process using the niobium precursor compound of claim 4.

* * * * *